(12) United States Patent
Wu et al.

(10) Patent No.: US 9,130,022 B2
(45) Date of Patent: Sep. 8, 2015

(54) METHOD OF BACK-END-OF-LINE (BEOL) FABRICATION, AND DEVICES FORMED BY THE METHOD

(71) Applicant: Taiwan Semiconductor Manufacturing Co., Ltd., Hsin-Chu (TW)

(72) Inventors: Shiauhan Wu, New Taipei (TW); Joung-Wei Liou, Zhudong Town (TW); Han-Ti Hsiaw, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 50 days.

(21) Appl. No.: 13/890,320

(22) Filed: May 9, 2013

(65) Prior Publication Data

US 2014/0264870 A1 Sep. 18, 2014

Related U.S. Application Data

(60) Provisional application No. 61/786,822, filed on Mar. 15, 2013.

(51) Int. Cl.
*H01L 21/4763* (2006.01)
*H01L 21/00* (2006.01)
*H01L 21/44* (2006.01)
*H01L 21/768* (2006.01)
*H01L 23/532* (2006.01)

(52) U.S. Cl.
CPC ...... *H01L 21/76879* (2013.01); *H01L 23/5329* (2013.01); *H01L 23/53295* (2013.01); *H01L 23/53223* (2013.01); *H01L 23/53238* (2013.01); *H01L 23/53252* (2013.01); *H01L 23/53266* (2013.01)

(58) Field of Classification Search
None
See application file for complete search history.

(56) References Cited

U.S. PATENT DOCUMENTS

| 6,143,645 | A  | * | 11/2000 | Hsu et al. | 438/627 |
|---|---|---|---|---|---|
| 6,348,421 | B1 | * | 2/2002 | Shu et al. | 438/788 |
| 8,329,578 | B2 |   | 12/2012 | Chang et al. | |
| 2004/0121571 | A1 | * | 6/2004 | Uchikoshi et al. | 438/586 |
| 2006/0189133 | A1 | * | 8/2006 | Dimitrakopoulos et al. | 438/687 |
| 2006/0274405 | A1 | * | 12/2006 | Waldfried et al. | 359/359 |
| 2010/0176513 | A1 | * | 7/2010 | Agarwala et al. | 257/758 |
| 2010/0308443 | A1 | * | 12/2010 | Suthiwongsunthorn et al. | 257/621 |
| 2012/0252206 | A1 | * | 10/2012 | Naik et al. | 438/653 |

OTHER PUBLICATIONS

U.S. Appl. No. 13/665,165, filed Oct. 31, 2012.
U.S. Appl. No. 13/833,794, filed Mar. 15, 2013.

* cited by examiner

*Primary Examiner* — Steven Loke
*Assistant Examiner* — Juanita B Rhodes
(74) *Attorney, Agent, or Firm* — Duane Morris LLP (57) ABSTRACT

In a method for forming a semiconductor device, an interconnect structure over a semiconductor substrate is provided. The interconnect structure includes a first dielectric layer and a conductive pattern inside a trench in the first dielectric layer. An etch stop layer (ESL) is formed over the interconnect structure. An interface layer comprising elemental silicon is deposited over the ESL. A second dielectric layer is then formed over the interface layer.

25 Claims, 7 Drawing Sheets

METHOD OF BACK-END-OF-LINE (BEOL) FABRICATION, AND DEVICES FORMED BY THE METHOD

This application claims the benefit of U.S. Provisional Application No. 61/786,822, filed Mar. 15, 2013, which application is expressly incorporated by reference herein in its entirety.

FIELD

The disclosed method and devices relate to semiconductors. More particularly, the disclosed subject matter relates to a method for back-end-of-line (BEOL) processing, and a resulting semiconductor device.

BACKGROUND

Modern semiconductor packages are formed from multiple stacked material layers that may include numerous active devices electrically coupled together by conductive metal interconnects and lines. Interconnect structures comprising metallization lines such as copper connect various components of semiconductor integrated circuits (ICs). The metallization lines within each interconnect layer are formed in an interlayer dielectric (ILD) material such as a low-k dielectric. The ILD material electrically isolates metallization lines from one another within each level and in adjacent levels of interconnect structures.

Back end-of-line ("BEOL") fabrication processes are used to create an intricate network of conductive interconnects in each layer and between the multiple layers. Damascene processes including single damascene process and dual-damascene process are routinely used for fabricating multi-level interconnect structures. In a damascene process, trenches and via holes are made inside and through an ILD layer, and filled with a conductive material, such as copper (Cu) or a Cu-based alloy, to create metallization lines and vertical conductive paths (vias) between adjacent layers.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Copper or copper-based alloy is used as a conductive pattern (plug), or in metallization lines of semiconductor interconnect structures because of its higher electrical conductivity. However, copper may diffuse through an ILD layer and a semiconductor substrate to cause device reliability issues or poison transistors in a semiconductor IC device. As ICs and semiconductor devices get smaller, the size of interconnect structures also decreases. To prevent copper diffusion becomes increasingly important to improve reliability of semiconductor devices.

In some embodiments, a diffusion barrier layer or a pre-ESL layer can be formed abutting a conductive pattern or metallization lines comprising copper or copper-based alloy to mitigate diffusion of copper in an interconnect structure. However, in the subsequent BEOL processes involving using an oxidizing gas, the oxidizing gas may diffuse into and oxidize the pre-ESL layer, the diffusion barrier layer, or even the conductive material.

Some embodiments in the present disclosure provide a method for forming a semiconductor device, particularly a semiconductor device having an interconnect structure comprising copper or copper alloy. In the method for forming a semiconductor device, the structure of the device and the fabrication processes are tailored to prevent diffusion of an oxidizing gas and possible resulting oxidation reactions, and provide a semiconductor device having good reliability. Some embodiments also provide a semiconductor device resulting from the method in the present disclosure.

Figure 1A:
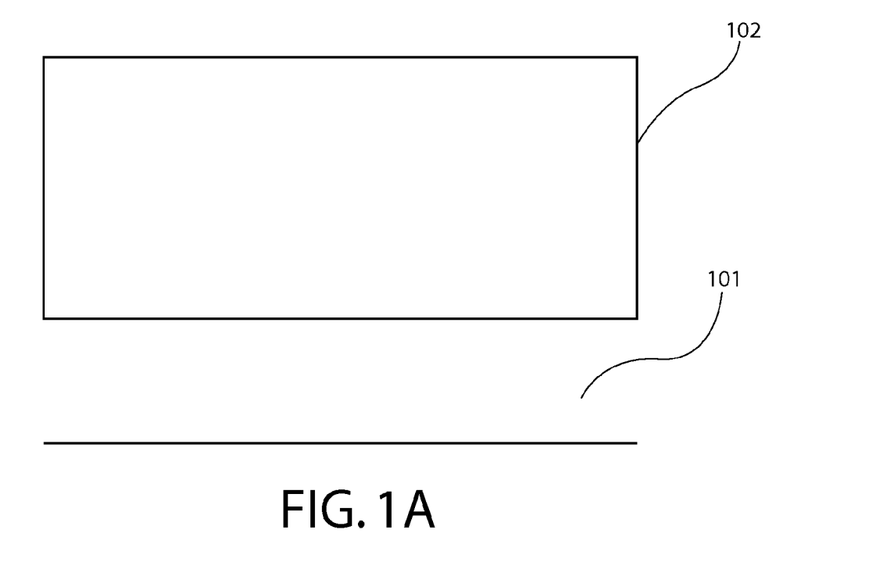
FIGS. 1A-1D are cross-sectional views of a portion of a semiconductor device during fabrication, illustrating an exemplary process of providing an interconnect structure over a semiconductor substrate in accordance with some embodiments.
Figure 1B:
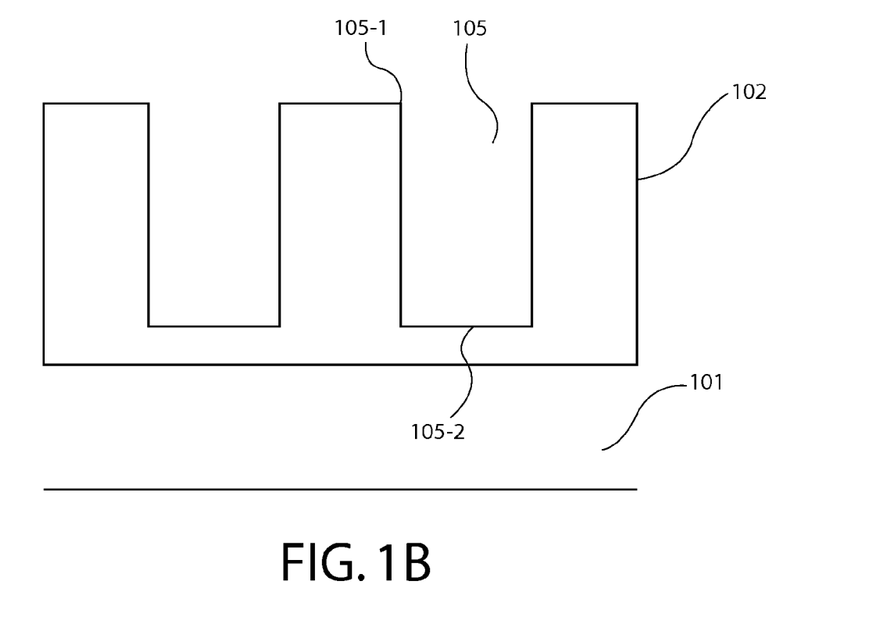
Figure 1C:
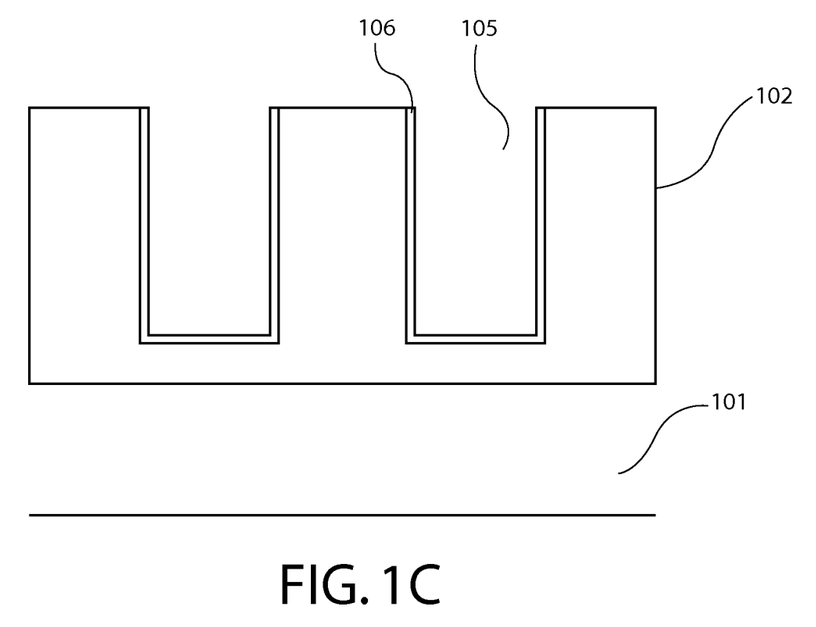
Figure 1D:
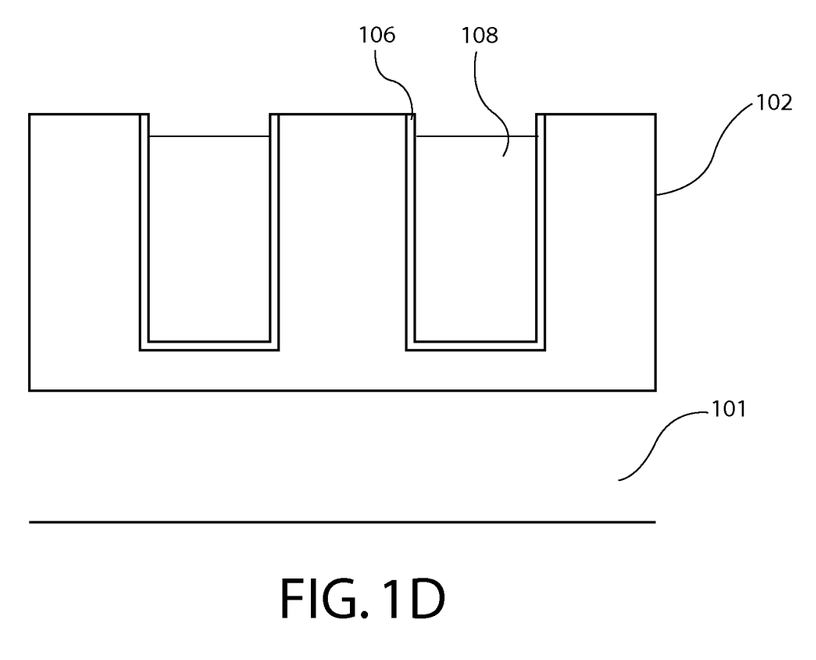
Figure 2A:
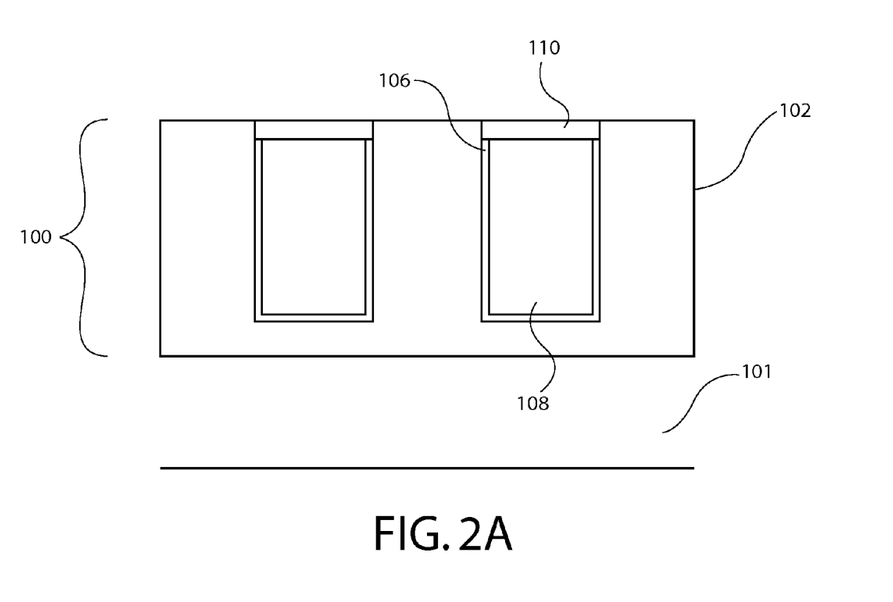
FIGS. 2A-2E are cross-sectional views of a portion of a semiconductor device during fabrication, illustrating an exemplary method for forming a semiconductor device in accordance with some embodiments.
Figure 2B:
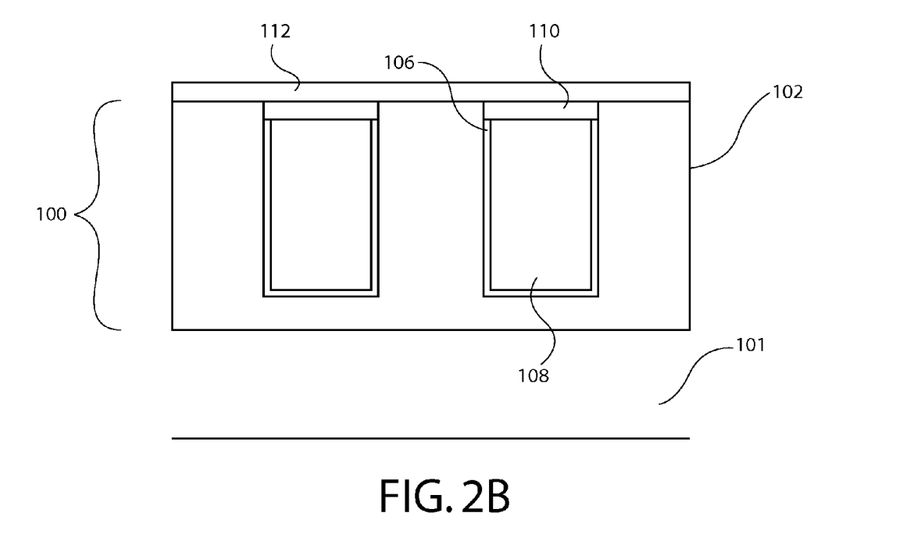
Figure 2C:
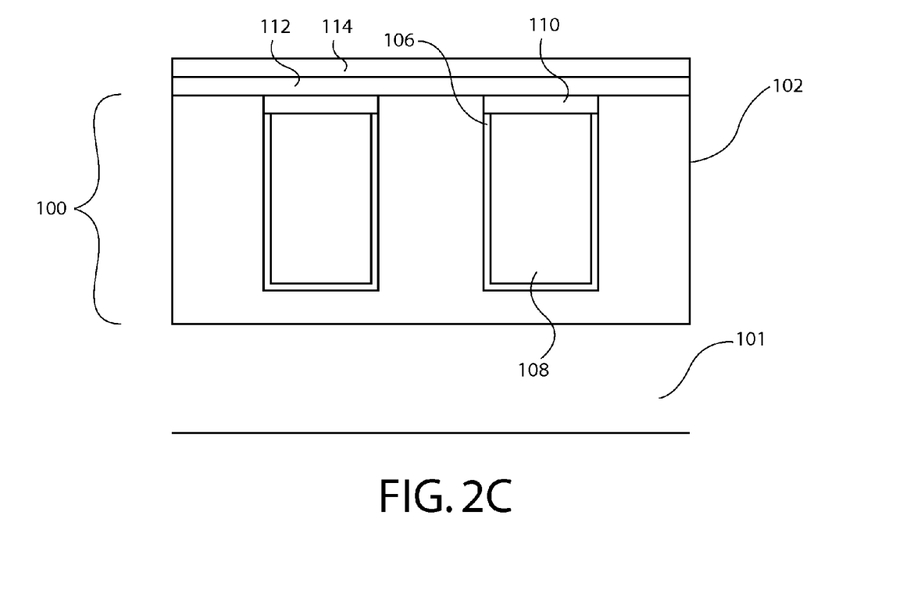
Figure 2D:
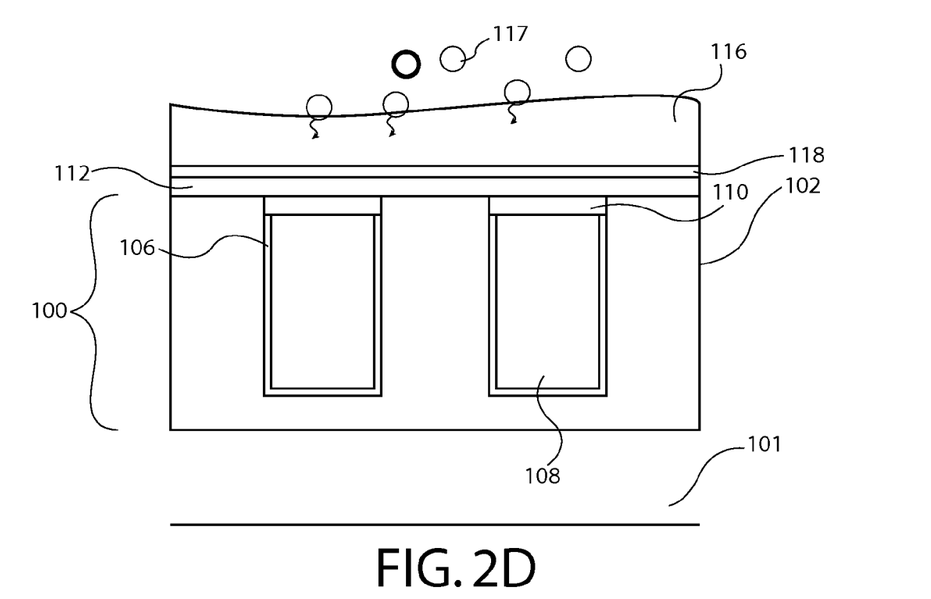
Figure 2E:
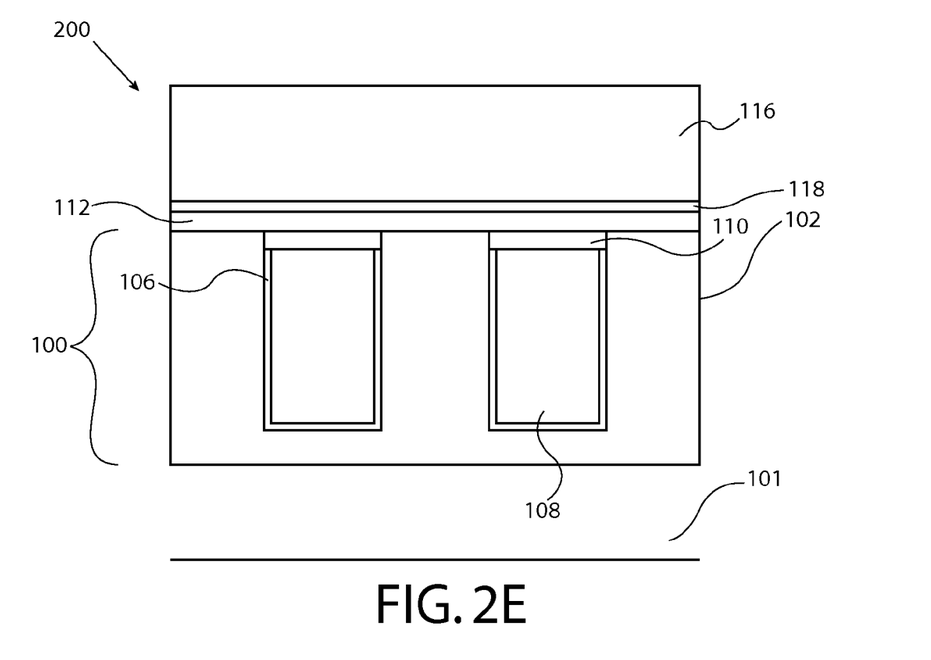
Figure 3:
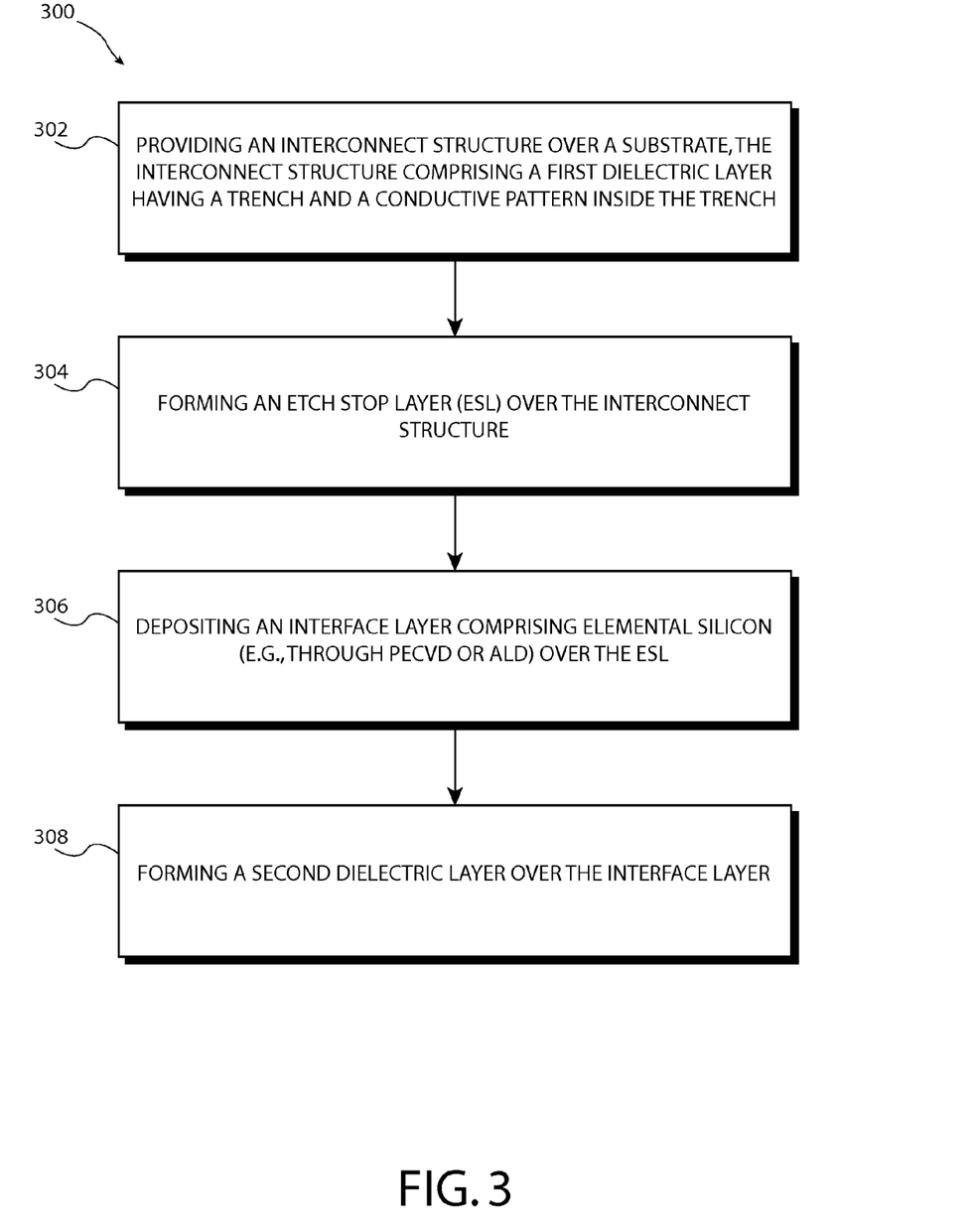
FIG. 3 is a flow chart illustrating an exemplary method for forming a semiconductor device in accordance with some embodiments.

In FIGS. 1A-1D and 2A-2E, like items are indicated by like reference numerals, and for brevity, descriptions of the structure, provided above with reference to the above figures, are not repeated. The method described in FIG. 3 is described with reference to the exemplary structure described in FIGS. 2A-2E. The method described in FIG. 4, illustrating one exemplary process step of the method of FIG. 3, is described with reference to the exemplary structure described in FIGS. 1A-1D.

FIG. 3 illustrates an exemplary method 300 for forming a semiconductor device 200 in accordance with some embodiments. FIGS. 2A-2E illustrates a portion of a semiconductor device 200 in a respective fabrication step.

Referring to FIG. 3, at step 302 of method 300, an interconnect structure 100 over a semiconductor substrate 101 is provided. An exemplary interconnect structure 100 is shown in FIG. 2A. Interconnect structure 100 comprises a first dielectric layer 102 and a conductive material or conductive pattern 108 inside a trench in the first dielectric layer 102. Conductive pattern 108 is referred as a conductive plug in some embodiments. In some embodiments, interconnect structure 100 further comprises an pre-ESL layer 110 over conductive pattern 108. Interconnect structure 100 can further comprise a barrier layer 106 disposed over a bottom wall and along a side wall of the trench in the first dielectric layer 102.

Figure 4:
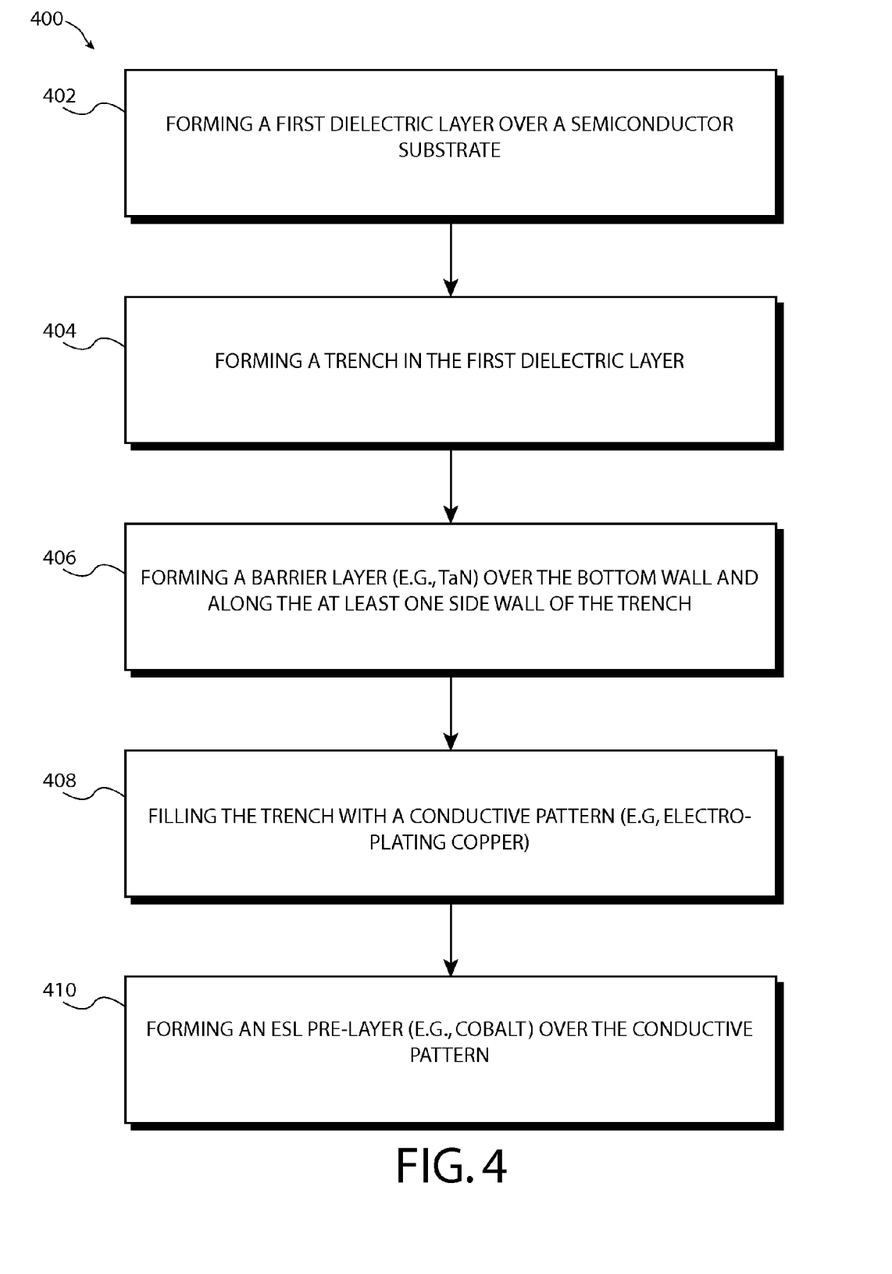
FIG. 4 is a flow chart illustrating an exemplary process of providing an interconnect structure over a semiconductor substrate in accordance with some embodiments.

FIG. 4 illustrates an exemplary process 400 of providing interconnect structure 100 over semiconductor substrate 101 in accordance with some embodiments. FIGS. 1A-1D illustrates the resulting structure in a respective fabrication step.

Referring to FIG. 4, at step 402, a first dielectric layer 102 is formed over a semiconductor substrate 101. The resulting structure of a portion of a semiconductor device is illustrated in FIG. 1A. The first dielectric layer 102 can have any suitable thickness. For example, the first dielectric layer 102 has a thickness in the range from 1,000 Angstroms to 2,000 Angstroms in some embodiments.

Substrate 101 can be a wafer comprising a semiconductor material. Examples of suitable materials for substrate 101 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass.

The method can also comprise forming other portions (not shown) of a semiconductor device such as transistors on or above substrate 101. For example, the other portions can include one or more of a buffer layer, an isolator layer or isolation structure such as a shallow trench isolation (STI) structure, a channel layer, a source region, a drain region, a gate stack and a gate dielectric layer. The method can comprise in-situ doping to form a source region and a drain region in the surface of substrate 101.

The first dielectric layer 102 can be formed of any suitable materials. Examples of a suitable material for the first dielectric layer 102 include but are not limited to silicon oxide, silicon oxynitride, undoped silicate glass (USG), phosphosilicate glass (PSG), borophosphosilicate glass (BPSG), combinations thereof, or other suitable material.

In some embodiments, the first dielectric layer 102 is formed of a low-k (LK) dielectric material. A low-k material has a dielectric constant (k) lower than 3, of a type suitable for forming ILD (inter-layer dielectric), also referred to as IMD (inter-metal dielectric) layers to electrically isolate interconnects. A low-k dielectric material is understood to encompass an extreme low-k (ELK) dielectric, and ultra low-k (ULK) dielectric. For example, an ELK dielectric material has a dielectric constant of about 2.6 or lower. An example of an ELK dielectric material is a trimethylsilane-based organosilicate glass with a dielectric constant as low as about 2.1. The first dielectric layer 102 is porous in some embodiments.

The first dielectric layer 102 can be formed by using chemical vapor deposition (CVD) or plasma enhanced CVD (PECVD), spin-on, sputtering, or other suitable method. For example, a precursor for the first dielectric layer 102 can be formed over semiconductor substrate 101 through spin-coating or CVD, followed by baking at an increased temperature. the first dielectric layer 102 can be then treated under ultraviolet light (UV) to improve its mechanical properties. This process is referred as "UV curing." In some embodiments, an oxidizing gas such as $O_2$, $O_3$ or other suitable oxygen-containing species can be introduced during the UV curing process.

At step 404, at least one trench 105 is formed in the first dielectric layer 102. A trench 105 has at least one side wall 105-1 and a bottom wall 105-2. The resulting device structure after step 404 is illustrated in FIG. 1B. Trench 105 is for the illustration purpose only, and can be understood to encompass vias, holes, openings or any other similar structures in a semiconductor device during or after fabrication. In some embodiments, a trench is formed first, and then a via is formed at the bottom of the trench. In other embodiments, a via is formed first, and then a trench is formed around an upper portion of the via.

In some embodiments, trench 105 can be formed using processes of masking and patterning using a photoresist, followed by an etching process, and/or other suitable processes. A dry or wet etching method can be used. In some embodiments, the first dielectric layer 102 is etched using a plasma such as a fluorine-containing plasma.

At step 406, a barrier layer 106 is formed over the bottom wall 105-2 and along the at least one side wall 105-1 of trench 105. The resulting device structure is illustrated in FIG. 1C.

Barrier layer 106 is formed of a diffusion barrier material. Examples of a suitable diffusion barrier material for barrier layer 106 include but are not limited to tantalum (Ta), TaN, TaN/Ta, TiN, TiSiN, W, TiW, or WN. Barrier layer 106 is formed by depositing a diffusion barrier material comprising tantalum nitride (TaN) in some embodiments. Barrier layer 106 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. In some embodiments, barrier layer 106 is made of TaN prepared using a PVD process. In some embodiments, barrier material 106 is deposited in a thickness in the range of about 5 angstroms to about 60 angstroms, for example, in the range of from about 20 angstroms to about 40 angstroms in some embodiments.

At step 408, trench 105 is filled with a conductive pattern 108. Conductive pattern 108 is formed of a conductive material. Conductive pattern 108 can be metallization lines within a layer or a vertical via between layers in a semiconductor interconnect structure. The resulting device structure after step 408 is illustrated in FIG. 1D. Conductive pattern 108 can have any suitable dimension. For example, conductive pattern 108 has a length in the range from 500 Angstroms to 1,500 Angstroms in some embodiments.

In some embodiments, conductive pattern 108 is formed of a conductive material comprising copper (Cu), aluminum (Al), silver (Ag), gold (Au), tungsten (W), or alloys thereof. Examples of a suitable material include but are not limited to copper, copper alloy, tungsten (W), any other suitable metal, and any combination thereof. In some embodiments, conductive pattern 108 comprises copper (Cu). Conductive pattern 108 can be formed by a process such as electric plating, chemical solution deposition, PVD, CVD, ALD and PECVD. For example, copper can be electroplated or sputtered in a vacuum chamber. In some embodiments, the step of filling the trench with a conductive pattern 108 includes electroplating a conductive material comprising copper.

At step 410, a pre-ESL layer 110 is formed over conductive pattern 108 in some embodiments. The resulting device structure is illustrated in FIG. 2A. A pre-ESL layer 110 can be formed of a material the same as or different from the diffusion barrier material for barrier layer 106 as described. In some embodiments, the step of forming the pre-ESL layer 110 comprises depositing a material comprising cobalt. Thin pre-ESL layer 110 comprising cobalt above the conductive pattern 108 can suppress electro-migration of copper, particularly when the device is operated at high voltage. The pre-ESL layer 110 can have any suitable thickness. For example, the pre-ESL layer 110 has a thickness in the range from 5 Angstroms to 200 Angstroms. In some embodiments, the pre-ESL layer 110 comprises cobalt at a thickness in the range of from 10 Angstroms to 50 Angstroms.

Referring back to FIG. 3, at step 304, an etch stop layer (ESL) is formed over the interconnect structure 100. The resulting device structure after step 304 is illustrated in FIG. 2B. The ESL 112 can be formed of silicon nitride, silicon oxynitride, silicon carbide, silicon oxycarbide, combinations thereof, or other suitable materials. In some embodiments, the CESL 112 is formed of silicon carbide. The ESL 112 can be formed by using chemical vapor deposition (CVD), high density plasma CVD, sputtering, or other suitable method. The CESL 112 can have any suitable thickness. For example, the CESL 112 has a thickness in the range from 100 Angstroms to 500 Angstroms.

At step 306, an interface layer 114 comprising elemental silicon is deposited over the ESL. The resulting device structure after step 306 is illustrated in FIG. 2C. The interface layer 114 is formed of any composition comprising elemental silicon. Interface layer 114 can comprise pure silicon or a mixture containing elemental silicon. "Elemental silicon" used in this disclosure can be understood to encompass single crystal silicon, polycrystalline silicon, amorphous silicon or any other suitable species. Interface layer 114 comprises more than 50% by weight, for example more than 75% by weight, of elemental silicon in some embodiments. Interface layer 114 is predominantly elemental silicon, such as a layer of silicon, in some embodiments. Examples of a mixture comprising elemental silicon include but are not limited to a mixture of silicon oxide and silicon. Interface layer 114 comprising elemental silicon can have any suitable thickness. In some embodiments, the interface layer 114 is a layer of silicon at a thickness in the range from 2 Angstroms to 500 Angstroms, for example, in the range from 5 Angstroms to 100 Angstroms.

Interface layer 114 can be formed by using CVD, high density plasma CVD, PECVD, ALD, sputtering, or other suitable method. In some embodiments, interface layer 114 comprising elemental silicon using a process of PECVD or ALD at a process temperature less than 500° C. For example, a layer of amorphous silicon can be deposited using a process of PECVD or ALD at a temperature less than 500° C.

At step 308, a second dielectric layer 116 is formed over interface layer 114 comprising elemental silicon. FIG. 2D illustrates an intermediate device structure during step 308. The resulting structure after step 308 is illustrated in FIG. 2E. After step 308, interface layer 114 comprising elemental silicon can be oxidized to become an interface layer 118 comprising a silicon-rich oxide. The elemental silicon in interface layer 114 is oxidized into silicon-rich oxide.

The second dielectric layer 116 can have any suitable thickness. For example, the second dielectric layer 116 has a thickness in the range from 1,000 Angstroms to 2,000 Angstroms in some embodiments. The second dielectric layer 116 can be formed of a material the same as or different from that of the first dielectric layer 102. The second dielectric layer 116 can be used as an ILD (IMD) layer.

In some embodiments, the second dielectric layer 116 is formed of a low-k (LK) dielectric material, including a general low-k dielectric, an extreme low-k (ELK) dielectric, and ultra low-k (ULK) dielectric. The dielectric constant (k) of the second dielectric layer 116 is less than 2.5 in some embodiments. The second dielectric layer 116 is porous in some embodiments. Both the first dielectric layer 102 and the second dielectric layer 116 can comprise a low-k material in some embodiments.

The second dielectric layer 116 can be formed of any suitable materials including inorganic materials, organic materials and inorganic-organic hybrids. Examples of a suitable material for the second dielectric layer 116 include but are not limited to silicon oxide, silicon oxynitride, undoped silicate glass (USG), phosphosilicate galss (PSG), borophosphosilicate glass (BPSG), combinations thereof, or other suitable material.

The second dielectric layer 116 can be formed by using chemical vapor deposition (CVD) or plasma enhanced CVD (PECVD), spin-on, sputtering, or other suitable method. For example, a precursor for the second dielectric layer 116 can be formed through spin-coating or CVD, followed by baking at an increased temperature.

Examples of a suitable precursor for the second dielectric layer 116 (and the first dielectric layer 102) include but are not limited to an alkylsilane and an alkoxylsilane such as methyldiethoxysilane (DEMS), trimethylsilane, tetramethylsilane, methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS). Example of suitable precursor can also include but are not limited to linear siloxanes and cyclic siloxanes such as octamethylcyclotetrasiloxane (OMCTS) and tetramethylcyclotetrasiloxane (TMCTS), combinations thereof, and the like.

A porogen material can be also included in a suitable precursor to provide porosity in the second dielectric layer 116. Examples of a suitable porogen include but are not limited to a solvent and any organic material of small molecules such as 1-isopropyl-1-4-methyl-1,3-cyclohexadiene (ATRP) or bicyclo(2.2.1)-hepta-2,5diene (BCHD). The porogen can be removed through baking or any other suitable process.

In some embodiments, the step of forming the second dielectric layer 116 comprises a curing process using ultraviolet light and an oxidizing gas 117, as shown in FIG. 2D. The UV curing process can also be performed at an increased temperature, for example, in the range of from 200° C. to 300° C. The UV curing process is used to improve its mechanical properties such as modulus and hardness. The resulting second dielectric layer 116 can have improved chemical stability and improved dimensional stability while having low dielectric constant (k). The dielectric constant of the second dielectric layer 116 can be lower than 2.5 in some embodiments.

An oxidizing gas 117 such as $O_2$, $O_3$ or other suitable oxygen-containing species can be introduced during the UV curing process. The oxidizing gas 117 can be introduced with a carrier gas comprising an inert gas such as argon, helium and nitrogen. The elemental silicon in interface layer 114 is oxidized into silicon-rich oxide by using oxidizing gas 117. The silicon-rich oxide can have a structure of a formula of $SiO_x$, where x is less than 2, for example, in the range from 1 to 2. However, the oxidizing gas 117 does not diffuse into other layers such as the pre-ESL layer 110, barrier layer 106 and conductive pattern 108. A possible oxidation of any of the pre-ESL layer 110, barrier layer 106 and conductive pattern 108 is avoided.

In some embodiments, deposition of the precursor for the second dielectric layer 106, the baking step, the UV curing process, the step of introducing an oxidizing gas can be performed sequentially or simultaneously.

As shown in FIG. 2E, an exemplary semiconductor device 200 comprises interconnect structure 100 over semiconductor substrate 101. Interconnect structure 100 comprises the first low-k dielectric layer 102 having a trench therein, and conductive material 108 disposed inside the trench. Interconnect structure 100 can further comprise barrier layer 106 disposed over a bottom wall and along a side wall of the trench in the first low-k dielectric layer 102, and the pre-ESL layer 110 over the conductive pattern 108. As described in FIGS. 1A-1D, the barrier layer 106 can comprise tantalum nitride (TaN), the conductive pattern 108 comprises copper, and the pre-ESL layer 110 comprises cobalt.

Semiconductor device 200 further comprises the ESL 112 over interconnect structure 100, interface layer 118 comprising silicon-rich oxide over the ESL 112, and the second low-k dielectric layer 116 over interface layer 118. In FIG. 2E, all the structures are described with reference to FIGS. 1A-1D and 2A-2E. However, interface layer 114 is transformed into interface layer 118 after the fabrication processes. In some embodiments, the silicon-rich oxide has a structure of a formula of SiOx, where x is less than 2, for example, in the range from 1 to 2. When x is the range from 1 to 2, a desirable performance of device 200 can be obtained in some embodiments. Interface layer 118 comprising silicon-rich oxide is different from the first low-k dielectric layer 102 or the second low-k dielectric layer 116 in some embodiments. Interface layer 118 can have any suitable thickness, for example, a thickness in the range from 5 Angstroms to 100 Angstroms. A single interface layer 118 of FIG. 2E is for illustration purpose only. Interface layer 118 having multiple layer structures can be formed in some embodiments. For example, interface layer 118 can comprise a layer of $SiO_2$ and a layer of silicon-rich oxide.

The present disclosure provides a method of fabricating a semiconductor device and a resulting semiconductor device. The method for forming a semiconductor device comprises: providing an interconnect structure over a semiconductor substrate, forming an etch stop layer (ESL) over the interconnect structure, depositing an interface layer comprising elemental silicon over the ESL, and forming a second dielectric layer over the interface layer. The interconnect structure comprises a first dielectric layer and a conductive pattern or a conductive pattern inside a trench in the first dielectric layer. In some embodiments, the interconnect structure further comprises an pre-ESL layer over the conductive pattern.

In some embodiments, the step of providing an interconnect structure over a semiconductor substrate comprises: forming a first dielectric layer over a semiconductor substrate, forming a trench having at least one side wall and a bottom wall in the first dielectric layer, forming a barrier layer over the bottom wall and along the at least one side wall of the trench, filling the trench with a conductive pattern, and forming an pre-ESL layer over the conductive pattern. In some embodiments, the barrier layer is formed by depositing a diffusion barrier material comprising tantalum nitride (TaN). In some embodiments, the step of filling the trench with a conductive pattern comprises electroplating a conductive material comprising copper. In some embodiments, the step of forming the pre-ESL layer comprises depositing a material comprising cobalt.

In some embodiments, the interface layer comprising elemental silicon is deposited over the ESL using a process of plasma enhanced chemical vapor deposition (PECVD) or atomic layer deposition (ALD). The interface layer can be a layer of silicon at a thickness in the range from 5 Angstroms to 100 Angstroms. In some embodiments, the step of forming a second dielectric layer comprises a curing process using ultra-violet light and an oxidizing gas. Both the first dielectric layer and the second dielectric layer can comprise a low-k material.

Some embodiments in the present disclosure provide a method for forming a semiconductor device comprising providing an interconnect structure over a semiconductor substrate. The interconnect structure comprises a first low-k dielectric layer having a trench therein, a conductive pattern filled inside the trench, and an pre-ESL layer over the conductive pattern. The method also comprises forming an etch stop layer (ESL) over the interconnect structure, depositing an interface layer comprising elemental silicon over the ESL; and forming a second low-k dielectric layer over the interface layer.

In some embodiments, the step of providing an interconnect structure over a semiconductor substrate comprises: forming a first low-k dielectric layer over a semiconductor substrate, and etching the first low-k dielectric layer to form a trench in the first low-k dielectric layer. The trench having at least one side wall and a bottom wall. The method further comprises: forming a barrier layer over the bottom wall and along the at least one side wall of the trench, filling the trench with a conductive pattern comprising copper, and forming an pre-ESL layer comprising cobalt over the conductive pattern. In some embodiments, the method further comprises a barrier layer disposed over a bottom wall and along a side wall of the trench. For example, the barrier layer comprises tantalum nitride (TaN). In some embodiments, the interface layer is a layer of silicon at a thickness in the range from 5 Angstroms to 100 Angstroms. In some embodiments, the step of forming a second dielectric layer comprises a curing process using ultra-violet light and an oxidizing gas.

In another aspect, the present disclosure provides a semiconductor device comprising an interconnect structure over a semiconductor substrate. The interconnect structure comprises a first low-k dielectric layer having a trench therein, and a conductive pattern disposed inside the trench. The interconnect structure can further comprise a barrier layer disposed over a bottom wall and along a side wall of the trench in the first low-k dielectric layer, and an pre-ESL layer over the conductive pattern. The semiconductor device further comprises an etch stop layer (ESL) over the interconnect structure, an interface layer comprising silicon-rich oxide over the ESL, and a second low-k dielectric layer over the interface layer. In some embodiments, the silicon-rich oxide has a structure of a formula of SiOx, where x is in the range from 1 to 2. In some embodiments, the interface layer comprising silicon-rich oxide is different from the first low-k dielectric layer or the second low-k dielectric layer. In some embodiments, the barrier layer comprises tantalum nitride (TaN), the conductive pattern comprises copper, and the pre-ESL layer comprises cobalt.

Although the subject matter has been described in terms of exemplary embodiments, it is not limited thereto. Rather, the appended claims should be construed broadly, to include other variants and embodiments, which may be made by those skilled in the art.

What is claimed is:

1. A method for forming a semiconductor device, comprising steps:

providing an interconnect structure over a semiconductor substrate, the interconnect structure comprising a first dielectric layer and a conductive pattern inside a trench in the first dielectric layer;

forming an etch stop layer (ESL) over the interconnect structure;

depositing an interface layer comprising elemental silicon over the ESL; and forming a second dielectric layer over the interface layer, wherein the step of forming the second dielectric layer comprises a process using an oxidizing agent, and the interface layer comprising elemental silicon is partially oxidized by the oxidizing agent to become an interface layer comprising silicon-rich oxide having a formula of SiOx, where x is less than 2, or a mixture of elemental silicon (Si) and silicon dioxide ($SiO_2$).

2. The method of claim 1, wherein the interconnect structure further comprises a pre-etch-stop layer (pre-ESL) over the conductive pattern.

3. The method of claim 2, wherein the step of providing an interconnect structure over a semiconductor substrate comprises:
   forming a first dielectric layer over a semiconductor substrate;
   forming a trench in the first dielectric layer, the trench having at least one side wall and a bottom wall;
   forming a barrier layer over the bottom wall and along the at least one side wall of the trench;
   filling the trench with a conductive pattern; and
   forming a pre-ESL over the conductive pattern.

4. The method of claim 3, wherein the barrier layer is formed by depositing a diffusion barrier material.

5. The method of claim 3, wherein the conductive pattern comprises copper.

6. The method of claim 3, wherein the step of forming the pre-ESL layer comprises depositing a material comprising cobalt.

7. The method of claim 2, wherein the interface layer comprising elemental silicon is deposited over the ESL using a process of plasma enhanced chemical vapor deposition (PECVD) or atomic layer deposition (ALD).

8. The method of claim 2, wherein the interface layer comprising elemental silicon is a layer of silicon at a thickness in a range from 5 Angstroms to 100 Angstroms.

9. The method of claim 2, wherein the step of forming a second dielectric layer comprises a curing process using ultra-violet light and an oxidizing gas.

10. The method of claim 2, wherein both the first dielectric layer and the second dielectric layer comprise a low-k material.

11. A method for forming a semiconductor device, comprising steps:
    providing an interconnect structure over a semiconductor substrate, the interconnect structure comprising a first low-k dielectric layer having a trench therein, a conductive pattern filled inside the trench, and a pre-etch-stop layer (pre-ESL) over the conductive pattern;
    forming an etch stop layer (ESL) over the interconnect structure;
    depositing an interface layer comprising elemental silicon over the ESL; and
    forming a second low-k dielectric layer over the interface layer, wherein the step of forming the second low-k dielectric layer comprises a process using an oxidizing agent, and the interface layer comprising elemental silicon is partially oxidized by the oxidizing agent to become an interface layer comprising silicon-rich oxide having a formula of SiOx, where x is less than 2, or a mixture of elemental silicon (Si) and silicon dioxide ($SiO_2$).

12. The method of claim 11, wherein the step of providing an interconnect structure over a semiconductor substrate comprises:
    forming a first low-k dielectric layer over a semiconductor substrate;
    etching the first low-k dielectric layer to form a trench in the first low-k dielectric layer, the trench having at least one side wall and a bottom wall;
    forming a barrier layer over the bottom wall and along the at least one side wall of the trench;
    filling the trench with a conductive pattern comprising copper; and
    forming a pre-ESL comprising cobalt over the conductive pattern.

13. The method of claim 11, further comprising a barrier layer disposed over a bottom wall and along a side wall of the trench.

14. The method of claim 11, wherein the interface layer comprising elemental silicon is a layer of silicon at a thickness in a range from 5 Angstroms to 100 Angstroms.

15. The method of claim 11, wherein the step of forming the second low-k dielectric layer comprises a curing process using ultra-violet light and an oxidizing gas.

16. A semiconductor device, comprising
    an interconnect structure over a semiconductor substrate, the interconnect structure comprising a first low-k dielectric layer having a trench therein, and a conductive pattern disposed inside the trench;
    an etch stop layer (ESL) over the interconnect structure;
    an interface layer over the ESL, wherein the interface layer comprises a layer of silicon dioxide ($SiO_2$) and a layer of silicon-rich oxide; and
    a second low-k dielectric layer over the interface layer.

17. The device of claim 16, wherein the interconnect structure further comprises a barrier layer disposed over a bottom wall and along a side wall of the trench in the first low-k dielectric layer, and a pre-etch-stop layer (pre-ESL) over the conductive pattern.

18. The device of claim 16, wherein the silicon-rich oxide having a formula of SiOx, where x is in a range from 1 to less than 2.

19. The device of claim 16, wherein the interface layer comprising silicon-rich oxide is different from the first low-k dielectric layer or the second low-k dielectric layer.

20. The device of claim 17, wherein the conductive pattern comprises copper, and the pre-ESL comprises cobalt.

21. The method of claim 1, wherein the interface layer comprises more than 50% by weight of elemental silicon.

22. The method of claim 1, wherein the interface layer comprises more than 75% by weight of elemental silicon.

23. The method of claim 1, wherein the interface layer consists essentially of elemental silicon.

24. The semiconductor device of claim 16, wherein the silicon-rich Oxide has a formula of $SiO_x$, where x is less than 2.

25. The semiconductor device of claim 16, wherein the interface layer comprises a mixture of elemental silicon (Si) and silicon ($SiO_2$).

* * * * *